United States Patent [19]

Glendinning

[11] Patent Number: 4,610,948
[45] Date of Patent: Sep. 9, 1986

[54] ELECTRON BEAM PERIPHERAL PATTERNING OF INTEGRATED CIRCUITS

[75] Inventor: William B. Glendinning, Red Bank, N.J.

[73] Assignee: The United States of America as represented by the Secretary of the Army, Washington, D.C.

[21] Appl. No.: 573,546

[22] Filed: Jan. 25, 1984

[51] Int. Cl.$^4$ .............................................. G03C 5/00
[52] U.S. Cl. .................................... 430/296; 430/312; 430/313; 430/316; 430/318; 430/394; 430/942
[58] Field of Search ............... 430/296, 394, 312, 311, 430/319, 942, 313, 316, 318

[56] References Cited

U.S. PATENT DOCUMENTS 4,264,711  4/1981  Greeneich ........................... 430/296
4,487,795  12/1984  Yasuda et al. ...................... 428/138

FOREIGN PATENT DOCUMENTS 55-56629  4/1980  Japan .................................... 430/296
83/03485  10/1983  PCT Int'l Appl. .................. 430/296

OTHER PUBLICATIONS

Potosky et al, J. Vac. Sci. Technol., 19(4), Nov./Dec. 1981, pp. 924-926.
Lin et al, J. Vac. Sci. Technol., 16(6), Nov./Dec. 1979, pp. 1669-1671.

Primary Examiner—John E. Kittle
Assistant Examiner—José G. Dees
Attorney, Agent, or Firm—Anthony T. Lane; Jeremiah G. Murray; Maurice W. Ryan

[57] ABSTRACT

Silicon wafers are imprinted with microelectronic circuit patterns by first lithographing the outlines or peripheries of all circuit features of a given wafer level by means of a narrow line formed by direct-writing electron beam lithography utilizing a positive electron resist, then using proximity photoprinting to complete the lithography of that level using a positive photoresist and a photomask with oversized opaque areas so that the pattern edges on the wafer exposed to the flux passing through the photomask will fall within the peripheral lines formed by the electron beam.

5 Claims, 4 Drawing Figures

U.S. Patent  Sep. 9, 1986  4,610,948
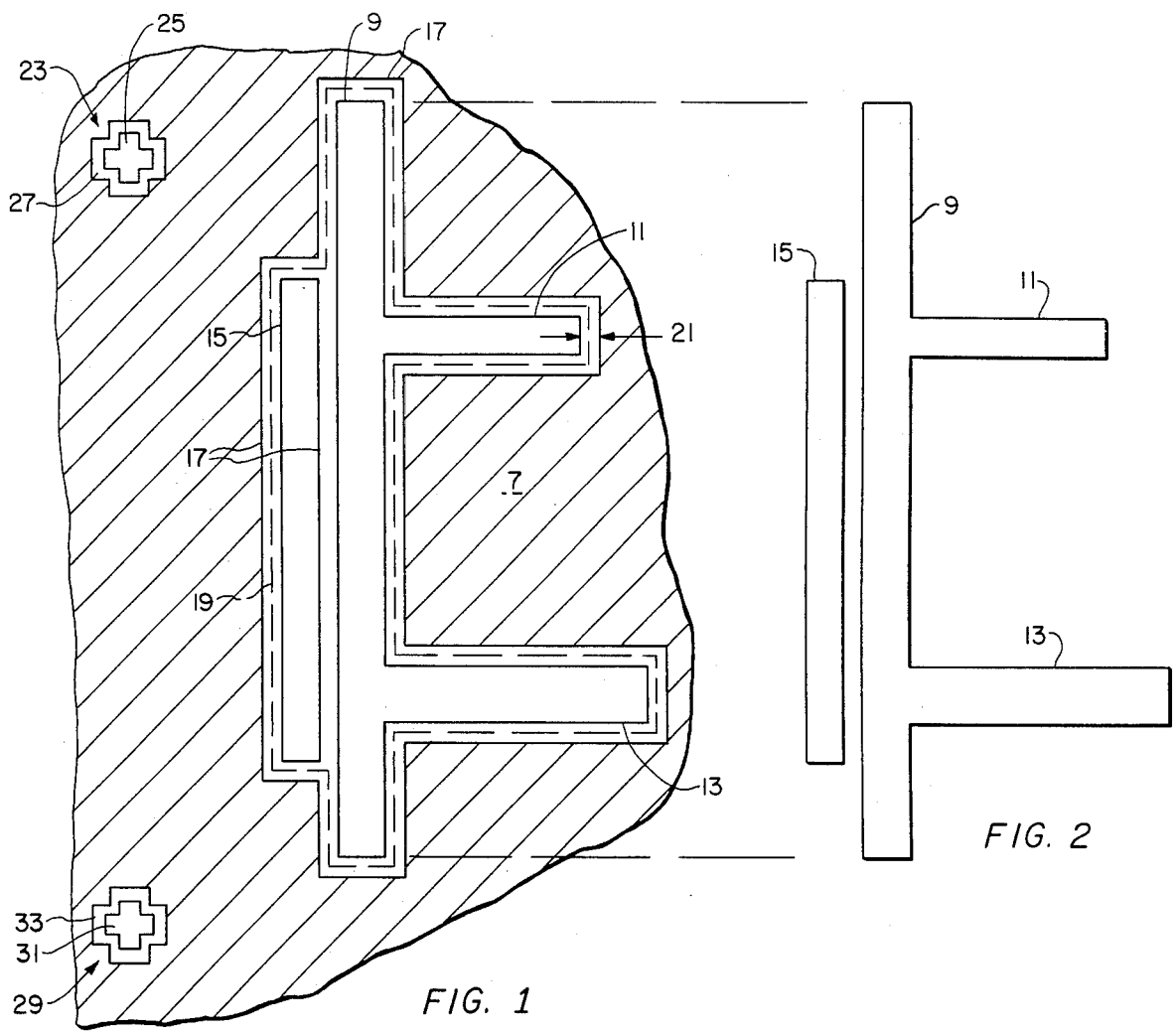
FIG. 1
FIG. 2
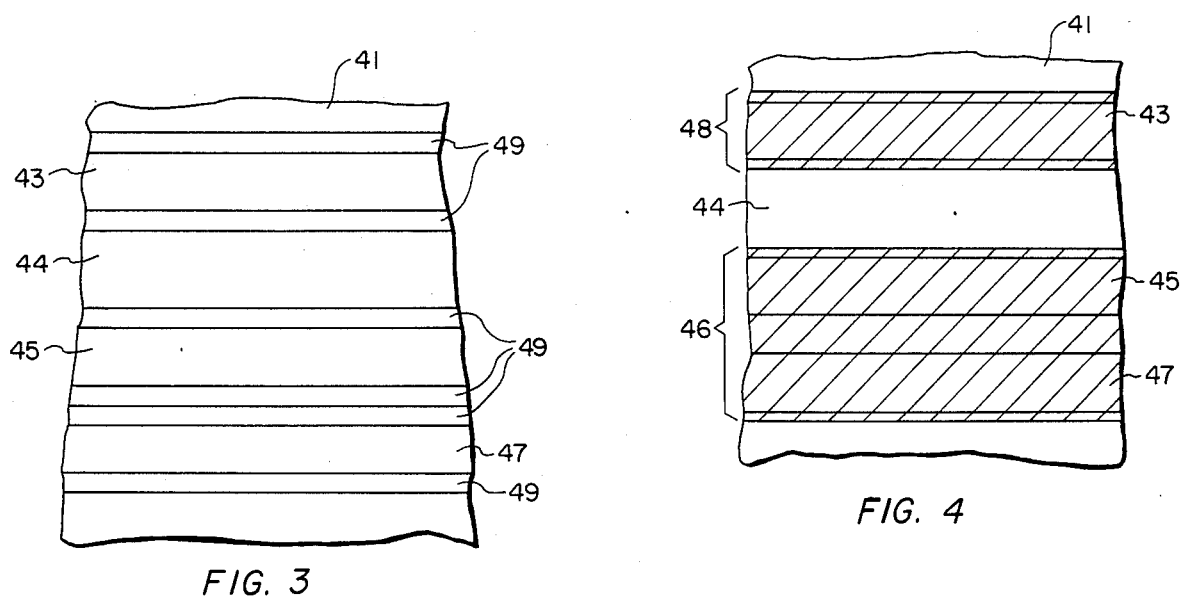
FIG. 3
FIG. 4

ELECTRON BEAM PERIPHERAL PATTERNING OF INTEGRATED CIRCUITS

The invention described herein may be manufactured, used and licensed by or for the Government for Governmental purposes without the payment to me of any royalties thereon.

BACKGROUND OF THE INVENTION

This invention relates to the fabrication of integrated circuits and more particularly to a novel technique or method of fabricating such circuits which involves a combination of direct writing electron beam lithography and photo replication by means of proximity printing.

Integrated circuit elements and the metallic interconnecting conductors thereon can be patterned on a wafer entirely by means of direct writing electron beam lithography (EBL), however this fabrication technique requires excessive beam writing time of complex and expensive EBL machines and the complex circuit and conductor patterns so lithographed with many different spacings and widths of lithographed features requires complex correction of the computer-stored pattern to correct for proximity effects. Proximity effects are the widening of the lithographed features caused by forward and backscattering of the electron beam as it penetrates the electron resist material which covers the wafer. The magnitude of the proximity effect and hence the correction factor required is a function, among other things, of the widths of the features being lithographed.

The use of photolithography to imprint patterns on a wafer by means of a patterned mask has been extensively used in the past but has numerous disadvantages for the fabrication of very large scale integrated circuits. Masks used for contact printing necessarily require close contact between the mask and the wafer and these masks can be easiy damaged by such contact and thus have short life. Proximity printing in which the mask is spaced from the wafer avoids the mask wear due to contact but it has fundamental limitations which make accurate and thus high density patterning impossible. These limitations comprise, for example, the diffraction of the ultraviolet flux as it passes through the mask and the formation of ultraviolet standing waves in the replication resist material. Also, it is impossible to obtain a sharp focus over the entire chip or wafer area with proximity printing.

The present hybrid technique or method eliminates most all of the disadvantges of the direct writing EBL technique and the photo mask replication technique to provide high accuracy, high density lithographing of integrated circuits in an economical and simple manner.

SUMMARY OF THE INVENTION

The invention involves peripheral delineation of pattern boundaries only by means of a Gaussian electron beam. The pattern boundaries are of fixed width, e.g. 0.5 microns, and outline all of the circuit and interconnect features. After development of the positive electron resist, the resultant pattern boundaries are etched. The wafer is then coated with a positive photoresist material and proximity printing is utilized to remove all of the background material, leaving the desired material within the peripheries which have been formed by electron beam lithography. The photo replication mask is made oversized so that the opaque areas of the mask overlap the peripheral pattern formed by the electron beam. This overlapping means that the inherent inaccuracy of the proximity printing step does not matter since the edges of the photolithographed features will fall within the peripheral lines previously lithographed by means of the electron beam.

It is thus an object of the invention to provide a novel method of lithographing microelectric patterns on silicon wafers, comprising first lithographing the outline or peripheries of all the features of a given level of the circuit by means of a narrow line formed by direct writing electron beam lithography utilizing positive electron resist, then using proximity photoprinting to complete the lithography of the said given level using a positive photoresist and a photomask with oversized opaque areas so that the pattern edges of the wafer exposed to the ulraviolet flux passing through said mask will fall within the peripheral lines previously lithographed by said electron beam.

Another object of the invention is to provide a hybrid lithography technique or method which combines the use of direct-writing electron beam lithography to form the boundaries or peripheries of a pattern and utilizes proximity printing by means of an oversized photomask and a positive photoresist to remove background material, whereby the edges of the pattern so formed are the result of electron beam lithography, and whereby the said background material is removed by a non-critical photolithograpy process.

A still further object of the invention is to provide a hybrid microelectronic lithographing technique which permits high accuracy and high pattern density while minimizing utilization time of electron beam lithography machines and which utilizes positive resists with the advantages thereof.

These and other advantages of the invention will become apparent from the following detailed description and the drawings.

BRIEF DESCRIPTION OF THE DRAWINGS

FIGS. 1 and 2 illustrate an arbitrary circuit pattern which has been fabricated by the method of the present invention.

FIGS. 3 and 4 illustrate the patterning of another configuration of conductors by means of the present invention.

DETAILED DESCRIPTION OF A PREFERRED EMBODIMENT

The high initial cost and maintenance of laboratory type direct-writing electron beam lithography machines has dictated the development of alternative writing procedures which will increase the throughput or output of these devices. This applies particularly to the typical laboratory device of this type which operates at slow scan speeds with target brightness in the range of 25–40 Amp./cm. with resist sensitivities above 1.2 microCoulombs/cm.$^2$, and wherein the microelectronic circuits to be patterned comprise dimensions and spacings in the submicron regions coupled with many larger features within the same mask level. Sometimes in the prior art two different beam sizes (coarse and fine) have been used to lithograph the different sized features and thus reduce the writing time for the larger features. This expedient however necessitates a two step writing procedure with a re-calibration between steps. An example where such a two step procedure might be advantageous would be the case of a conductive level comprising large pads with fine line interconnects.

Negative electron resist has been used in the prior art for defining and patterning of metal interconnects, polysilicon interconnects and other layers. These negative resists have lower resolution than positive resists due to the greater scattering of the electron beam therein and also are subject to swelling during curing to a greater degree than are positive resists.

Since electron scattering and hence the proximity effects caused thereby are a function of the width of the lines and features being lithographed, a pattern with many different line and feature widths will require the measurement of all the different proximity effects and complex correction of the computer software in which the pattern is stored to compensate for the proximity effects. The proximity effect produces exposure of the electron resist outside of the path of the electron beam and the software correction comprises narrowing the path of the beam by the amount of the different proximity effects so that the resultant exposed areas caused directly by the electron beam and indirectly by the scattering or proximity effects conform to the pattern desired to be lithographed.

The method of the present invention utilizes only narrow lines of fixed width to outline the circuit features by electron beam lithography in a positive electron resist and hence the proximity effect can often be neglected since it is small, or if it must be corrected for, a simple, single factor can be applied to the circuit pattern data as stored in the computer memory to effect the required correction.

The remaining background material is removed by means of a rapid and non-critical optical patterning step and a self-limiting etch, as explained in the examples to follow.

FIGS. 1 and 2 illustrate the novel method being used to lithograph an arbitrary circuit pattern which may comprise a small portion of a layer of conductors of a very large scale integrated circuit. The pattern of conductors to be lithographed as shown in FIG. 2, comprises a vertical bar 9 of a given width with a slightly narrower horizontal bar 11 connected thereto and a slightly wider horizontal bar 13 also connected thereto. An insulated, isolated conductor 15 lies parallel to bar 9 a short distance away. Such a pattern of conductors would normally comprise the interconnections for the active or passive circuit elements which have been previously lithographed on lower levels of the same chip or microelectronic circuit. These conductors thus connect the circuit elements to each other and to the outside world via large pads, not shown. Before lithographing the conductive layer, the entire surface of the wafer is coated with a thin film of the conductor material such as aluminum by well known techniques.

Since the present technique involves both EBL and photo replication, two sets of benchmarks are required to achieve the proper registration or alignment of the wafer relative to the EBL machine's axis or to the photomask. FIG. 1 is a top view of a portion of a wafer being processed according to the present invention and the EBL benchmarks 23 and 29 are lithographed thereon. The benchmarks 23 and 29 comprise small crosses 25 and 31 of the metal film with larger crosses 27 and 33 surrounding them. The crosses 27 and 33 are formed by etching away the metal film. Other benchmarks required are two optical or replication benchmarks comprising mating concentric crosses (not shown) which are compatible for alignment purposes with benchmarks 23 and 29. Two pairs of these optical benchmarks would be required, two on the wafer and two on the optical photomask.

FIG. 1 shows the wafer after the outlines or peripheries of the conductive areas of the desired pattern have all been delineated in a positive electron resist by means of a thin electron beam which has exposed the lines 17 around all of the conductive pattern which comprises the bars 9, 11, 13, and 15. It should be noted that the positive electron resist is applied by well known techniques to the entire wafer surface after the thin film conductive layer is applied thereto. The width of the peripheral line 17, indicated by numeral 21 may for example be approximately 0.5 microns. This peripheral line width should be minimized to reduce EBL machine writing time but must not be wider than the closest spacing of adjacent conductors of the circuit pattern being laid down. In the illustrative pattern of FIGS. 1 and 2 the spacing between the conductive bars 9 and 15 represents this minimum conductor spacing and likewise the maximum peripheral line width. In FIG. 1 the shaded area 7 represents the background conductor area which must be removed to leave only the desired outlined conductors. After the peripheral lines 17 have been exposed by the electron beam, the electron resist is developed to remove the resist from the lines 17. The wafer is then etched to remove the conductive film under the lines 17, the remaining areas of the wafer being protected from the etching solution by the electron resist layer thereon.

After etching of the peripheral lines or moats 17, the remaining electron resist is removed and the wafer prepared for the optical replication steps. This involves applying a positive replication resist to the entire wafer. The wafer is then photolithographed to remove the background conductive material 7 which is outside of the peripheral line 17. This is done by means of proximity printing using a photomask spaced from the wafer and exposing all of the background conductive areas 7 through said mask by means of ultraviolet flux. Since positive replication resist is being used, the photomask will be opaque in the areas where the conductive pattern is to remain, that is in the areas of the bars 9, 11, 13, and 15, and will be transparent to the ultra-violet flux in other areas. In accordance with one feature of the invention, these opaque areas of the mask are made slightly oversized by an amount equal to half the width of the peripheral lines 17, so that the photo mask, when properly regestered with the wafer, will have the edges of its opaque areas falling approximately along the centerline of the peripheral line 17. The dashed line 19 of FIG. 1 represents the edge of the opaque areas as projected onto the wafer. Thus all of the background area 7 outside of the dashed line 19 will be exposed to the ultra violet replication flux and the subsequent development will remove the replication resist therefrom, permitting the underlying conductive layer to be etched away. The conductors 9, 11, 13, and 15, not being exposed to the flux, will retain the replication resist which will protect these areas from the second or replication etching step.

It can be seen that the photo-replication etching step by means of proximity printing is a non-critical step in that none of the aforementioned disadvantages of photolithography will degrade the quality of the finished product. This follows from the fact that the edges of all the conductive areas of the pattern are formed by electron beam lithography. By using the oversized replication mask the ultraviolet replication flux can be spaced from the edges of the previously defined conductive areas so that the inherently poor resolution of the photo replication by means of proximity printing is immaterial.

The line width of 0.5 microns suggested above means that the opaque areas of the photo-replication mask should be made half this distance or 0.25 microns oversized so that the edge of the opaque area, 19 in FIG. 1, as projected onto the wafer will fall along the center of the peripheral line 17. In FIG. 1, the peripheral line width 21 has been deliberately chosen as equal to the minimum spacing between adjacent conductive areas. This minimum is between the bars 9 and 15. It can be seen that this expedient simplifies the geometry of the photo-replication mask since no background material remains to be removed between these conductor bars.

Also, similar simplification the photomask can be achieved if the width of the peripheral lines is made equal to one-half the minimum spacing of adjacent features. This expedient is illustrated by FIGS. 3 and 4 which shows a small portion 41 of a microelectronic circuit comprising three parallel conductors 43, 45, and 47. FIG. 3 shows the circuit with the peripheral lines 49 outlining the three parallel conductors. The conductors 43 and 45 are relatively widely spaced with the insulated region 44 between them, plus the two peripheral line widths 49. The conductors 45 and 47 are spaced by twice the peripheral line width and hence the two adjacent and abutting electron beam formed lines 49 between these conductors together form the entire spacing therebetween. FIG. 4 shows the photomask required for the pattern of FIG. 3, the opaque areas thereof being indicated by the two hatched areas 48 and 46. As can be seen, only a single opaque area 46 is required for the two closely spaced parallel conductors 45 and 47.

While the invention has been illustrated in connection with a layer or level of microelectronic circuit comprising conductors, other layers such as circuit elecment layers, silicon dioxide or polysilicon layers can be patterned using this technique.

X-ray or ion beam flux can also be used in the photo replication steps, however the use of either of these types of flux results in higher costs and hence the use of ulraviolet flux is preferred.

Obvious variations of this invention will occur to those skilled in the art, accordingly the invention should be limited only by the scope of the appended claims.

I claim:

1. A method of fabricating a pattern of conductors on a silicon wafer which has been previously patterned with circuit elements, comprising the steps of; applying a thin film of conductive metal to said wafer, applying a positive electron resist over said thin film, then exposing the peripheries of all of the conductors to be patterned on said wafer by means of direct-writing electron beam lithography, developing said lithographed wafer to remove said positive electron resist over said exposed peripheries, then etching said peripheries by removing the conductive material thereon, then removing all of the remaiing positive electron resist from said wafer and coating said entire wafer with a positive photo replication resist, then utilizing proximity photo printing utilizing a photomask with opaque areas slightly larger than the said conductors to be patterned on said wafer, then exposing all of said positive replication resist outside of said opaque areas to ultraviolet flux which has passed through said photomask, then developing said replication resist and removing said replication resist from all areas exposed to said ultraviolet flux and then etching away the conductive thin film underlying the said areas exposed to said ultraviolet flux.

2. The method according to claim 1 wherein the means of direct writing electron beam lithography exposing the peripheries of all the conductors to be patterned on said wafer defines peripheral lines of fixed narrow width.

3. The method of claim 2 wherein the width of said narrow lines is equal to form ½ of the smallest spacing to the smallest spacing between said circuit elements.

4. The method of claim 1 wherein the opaque areas of said photomask are made oversized by approximately half the width of said peripheral lines, whereby the edge of the ultraviolet flux projected on to said wafer will fall approximately along the centers of said peripheral lines.

5. The method of claim 4 wherein said peripheral lines are 0.5 microns in width and the opaque areas of said photomask are made 0.25 microns oversized.

* * * * *